(12) United States Patent
Magnus et al.

(10) Patent No.: US 7,892,950 B2
(45) Date of Patent: Feb. 22, 2011

(54) METHODOLOGY FOR PROCESSING A PANEL DURING SEMICONDUCTOR DEVICE FABRICATION

(75) Inventors: Alan J. Magnus, Gilbert, AZ (US);
Justin E. Poarch, Gilbert, AZ (US);
Jason R. Wright, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 119 days.

(21) Appl. No.: 12/432,540

(22) Filed: Apr. 29, 2009

(65) Prior Publication Data

US 2010/0279467 A1 Nov. 4, 2010

(51) Int. Cl.
*H01L 21/46* (2006.01)
*H01L 21/78* (2006.01)
*H01L 21/301* (2006.01)

(52) U.S. Cl. .............. 438/464; 257/E21.238; 438/458; 438/462; 438/465

(58) Field of Classification Search .......... 257/E21.238; 438/458, 462, 464, 465
See application file for complete search history.

(56) References Cited

U.S. PATENT DOCUMENTS

| | | | |
|---|---|---|---|
| 6,403,449 B1 | 6/2002 | Ball | |
| 6,498,099 B1 | 12/2002 | McLellan et al. | |
| 6,818,973 B1 | 11/2004 | Foster | |
| 6,821,867 B2 | 11/2004 | Matsuura et al. | |
| 6,905,891 B2 | 6/2005 | Kovar et al. | |
| 7,183,136 B2 | 2/2007 | Hashimura et al. | |
| 7,211,471 B1 | 5/2007 | Foster | |
| 7,371,613 B2 | 5/2008 | Shimanuki | |
| 2007/0161211 A1* | 7/2007 | Sunohara et al. | ............ 438/455 |
| 2008/0194060 A1 | 8/2008 | Shimanuki | |

* cited by examiner

*Primary Examiner*—Asok K Sarkar
(74) *Attorney, Agent, or Firm*—Meschkow & Gresham, P.L.C.

(57) ABSTRACT

A method (20, 104) for processing a panel (26, 128) during semiconductor device (52) fabrication entails forming grooves (72, 142) in a surface (34, 132) of the panel (26, 128) coincident with a dicing pattern (54) for the panel (26, 128). The grooves (72, 142) extend partially through the panel (26, 128) so that the panel (26, 128) remains intact. The grooves (72, 142) relieve stress in the panel (26, 128) to reduce panel (26, 128) warpage, thus enabling the panel (26, 128) to be reliably held on a support structure (88, 98, 138) via vacuum when undergoing further processing, such as solder printing (86). The method (20, 104) further entails, dicing (96, 152) through the panel (26, 128) from the surface (34, 132) in accordance with the dicing pattern (54) while the panel (26, 128) is mounted on the support structure (98, 138) to singularize the semiconductor devices (52).

19 Claims, 8 Drawing Sheets

METHODOLOGY FOR PROCESSING A PANEL DURING SEMICONDUCTOR DEVICE FABRICATION

TECHNICAL FIELD OF THE INVENTION

The present invention relates generally to semiconductor device fabrication processes. More specifically, the present invention relates to processing a warped panel of unsingularized semiconductor devices.

BACKGROUND OF THE INVENTION

In the process of manufacturing a package containing an embedded semiconductor die, undesirably low device yield can occur due to the processing methodology. For example, an embedded device panel comprises one or more semiconductor dies and an encapsulant. The encapsulant surrounds the one or more semiconductor dies on at least three side surfaces of each semiconductor die, with at least an active side of the one or more semiconductor dies exposed for further processing. During manufacturing, high temperature processes and materials mismatch between the encapsulant, semiconductor dies, and build-up layers, and encapsulant shrinkage can cause the panel to warp.

Due to warping of the panel, a number of problems can occur. For example, an excessively warped panel cannot be processed on high speed fully automated handling equipment, which also includes integrated inspection and package pick and placement. The warped panel cannot be processed on such handling equipment due to an inability to attain a reliable vacuum using a conventional tape-less support structure, sometimes referred to as a tape-less contact chuck. In particular, it is difficult to maintain an airtight seal between an excessively warped panel and the tape-less contact chuck. Thus, vacuum can be lost and the panel, or a portion of the panel, can dislodge from the chuck and become damaged from contact with external surfaces. Consequently, an alternative and, typically more costly, process flow may be called for to handle the warped panels. Such a process flow may entail dicing, or singularizing, the panel on tape, followed by picking the singularized semiconductor devices from the tape, and placing the devices into carriers using a different equipment set.

Some semiconductor device designs call for fine pitch land grid array (LGA), which require solder pre-tinning. Solder pre-tinning is typically performed by implementing stencil printing and reflow techniques while the panel is held onto a tape-less chuck through the application of a vacuum. However, for some large array panels, the warp is so severe that a sufficient vacuum to support the stencil process cannot be attained. In addition, consistent spacing between the warped substrate, i.e., panel, and the stencil is not possible. Consequently, inconsistent solder paste application may occur, again contributing to a decrease in yield. An alternative process flow may be to singularize the semiconductor devices first, followed by solder pre-tinning. Such a process may be viable but is highly inefficient.

The risk for warp of the panel, or substrate, is especially high in a prototype environment where non-fully populated panels, material changes, or short flows are necessary for quick cycles of learning. In addition, warp is becoming increasingly difficult to control in a full production environment as panel size is increased and/or as panel thickness is reduced.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Embodiments of the invention entail methodology for processing a panel during semiconductor device fabrication. In particular, the methodology reduces problems during the fabrication of semiconductor devices associated with warped panels. The methodology allows for reliable vacuum on a conventional tape-less support structure, i.e., contact chuck, so as to enable consistent and time efficient solder printing and to enable the singularizing of excessively warped large panel semiconductor device arrays on high speed fully automated handling equipment.

Figure 1:
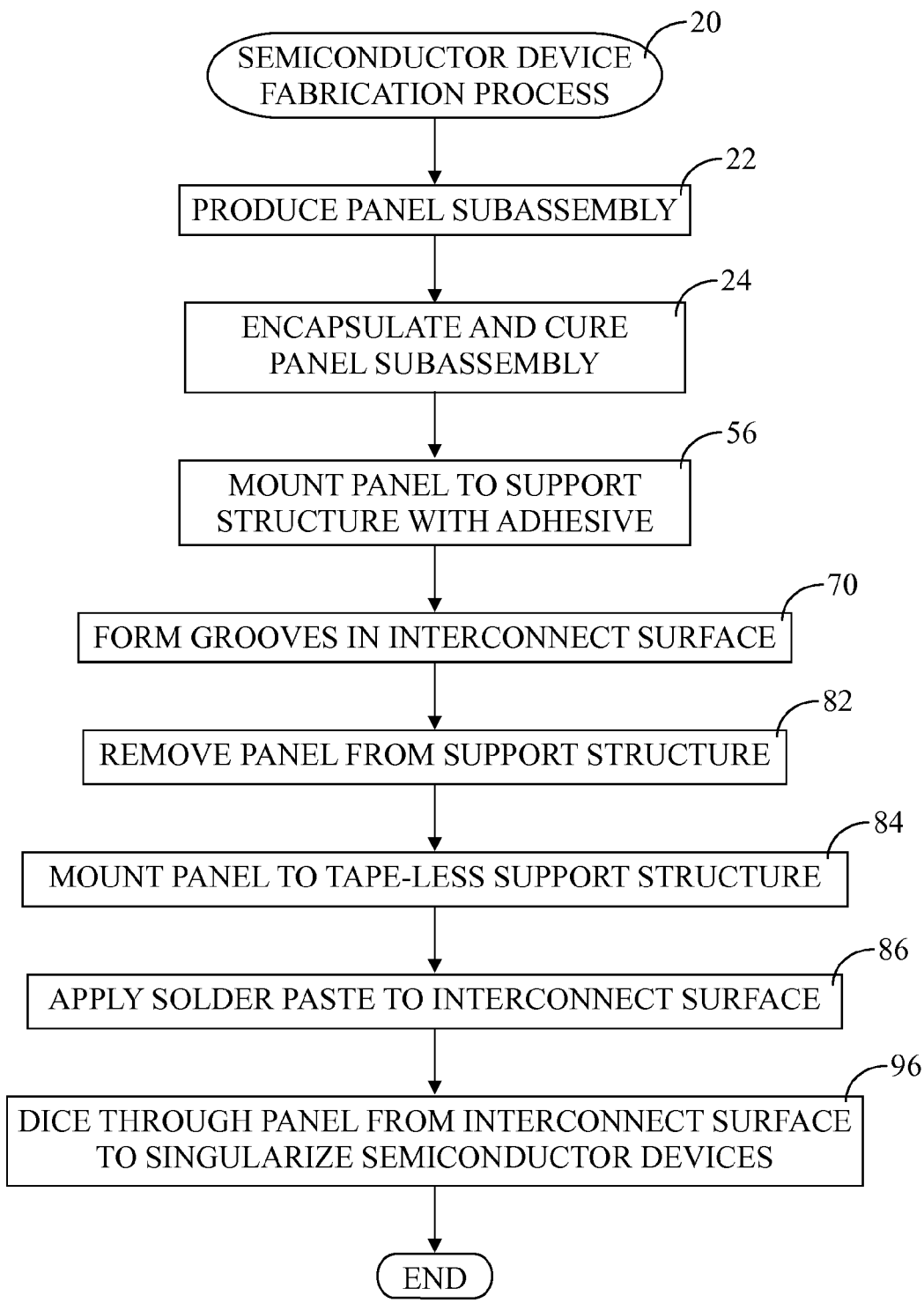
FIG. 1 shows a flowchart of a semiconductor device fabrication process in accordance with an embodiment of the invention.

FIG. 1 shows a flowchart of a semiconductor device fabrication process 20 in accordance with an embodiment of the invention. Process 20 describes a semiconductor packaging technique in which semiconductor dies and associated components are attached to a substrate and then encapsulated to form a strip, or panel, of semiconductor devices for further processing. The encapsulation process may cause the underlying substrate to warp, and this warpage may be exacerbated in a large panel array and/or when the panel is not fully populated with semiconductor devices such as in a prototype environment. Process 20 includes operations that reduce the warpage in such a panel in order to facilitate further processing. The operations that reduce panel warpage may also be implemented in connection with a chips-first packaging technique which will be discussed below in connection with FIGS. 16-21.

Semiconductor device fabrication process 20 begins with a task 22. At task 22, a panel subassembly is produced. In an embodiment, production of a panel subassembly entails attaching semiconductor dies and their associated components to a substrate. Wirebonds and other appropriate connections may be formed between bonding pads on the semiconductor dies, contacts on the substrate, and/or between the various components in accordance with semiconductor device design. The substrate may include conductive traces on both sides of the substrate that are used to electrically interconnect semiconductor dies and their associated components, and to electrically interconnect with external devices. The term "producing" refers to fabricating all or a portion of the panel subassembly at the facility that is fabricating the semiconductor devices and/or acquiring the panel subassembly from a different manufacturing facility.

Following task 22, a task 24 is performed. At task 24, the surface of the substrate on which the semiconductor dies and components are attached is encapsulated with a molding material to form a panel of semiconductor dies. The molding material may then be cured. The molding material may be a silica-filled epoxy molding compound, thermosetting resin material, or another known or upcoming molding material.

Figure 2:
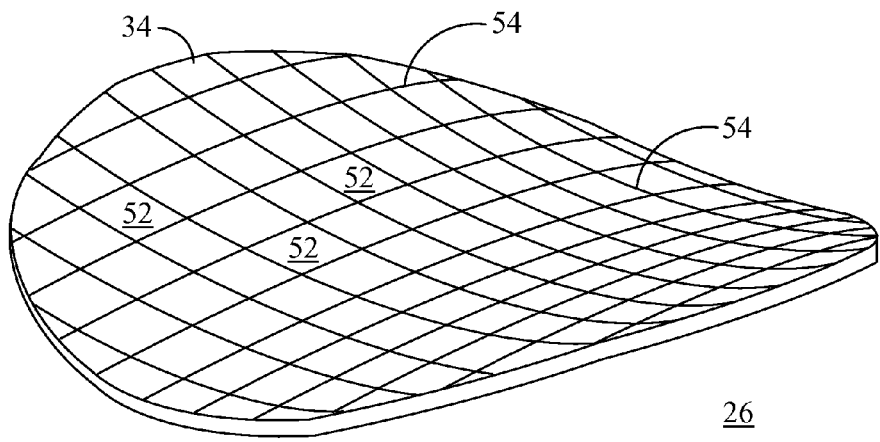
FIG. 2 shows an isometric view of an embedded semiconductor device panel exhibiting a degree of warping.
Figure 3:
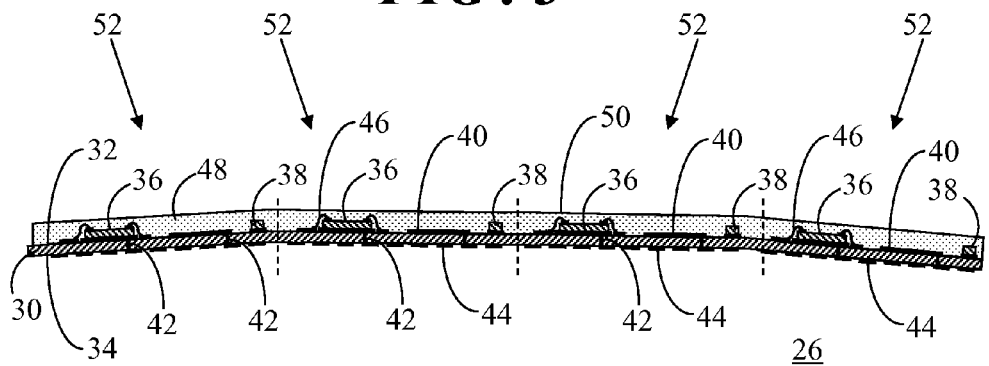
FIG. 3 shows a side view of the panel of FIG. 2 exhibiting the warping.
Figure 4:
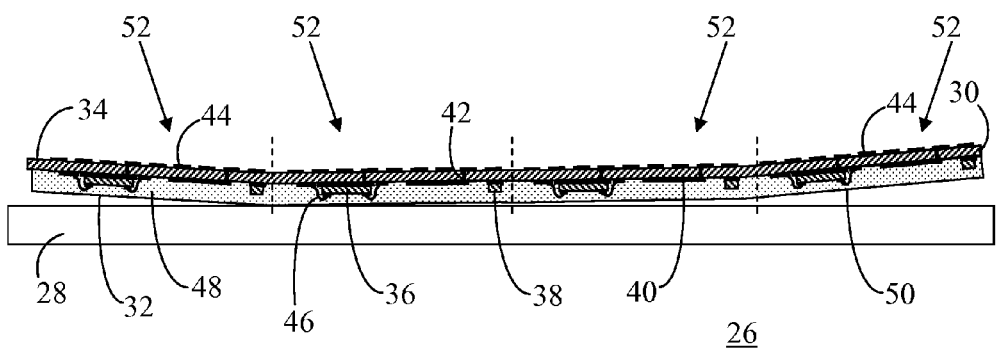
FIG. 4 shows a side view of the panel of FIG. 2 placed on a support structure in preparation for further processing.

Referring to FIGS. 2-4, FIG. 2 shows an isometric view of an embedded semiconductor device panel 26 exhibiting a degree of warping. FIG. 3 shows a side view of panel 26, and FIG. 4 shows a side view of panel 26 placed on a support structure 28 in preparation for further processing. Panel 26 is produced through the execution of tasks 22 and 24 of semiconductor device fabrication process 20. Panel 26 includes a substrate 30 having surfaces 32 and 34. A plurality of semiconductor dies 36 and additional active and/or passive components 38 are attached to surface 32.

Substrate 30 may be an organic substrate. An organic substrate is generally a material that contains carbon and hydrogen, and usually other elements such as nitrogen, sulfur, and oxygen. A printed circuit board is an example of an organic substrate because the laminate material of a printed circuit board is made of glass fibers in an epoxy, and epoxies are carbon based. Thus, substrate 30 may be a printed circuit board. Substrate 30 can include electrically conductive traces 40, conductive vias 42 extending through substrate 30, and external contacts 44 formed on surface 34 that may be utilized to provide electrical interconnection between semiconductor dies 36, components 38, and external devices (not shown). Semiconductor dies 36 may be in electrical contact with conductive traces 40, conductive vias 42, and external contacts 44 via wirebonds 46. Since surface 34 includes external contacts 44, surface 34 is referred to hereinafter as interconnect surface 34.

Panel 26 further includes a molding material 48 applied over surface 32 that encapsulates dies 36, components 38, and wirebonds 46. Molding material 48 forms an external surface 50 of panel 26 and provides protection to the encapsulated dies 36, components 38, and wirebonds 46 from hostile environments. Accordingly, semiconductor dies 36 and components 38 are interposed between external surface 50 of panel 26 and interconnect surface 34 of substrate 30.

Panel 26 includes a plurality of semiconductor dies 36 and components 38 that make up a plurality of unsingularized semiconductor devices 52. Processing of panel 26, as discussed below, entails dicing, sawing, or etching panel 26 to singularize (i.e., separate) semiconductor devices 52. Accordingly, interconnect surface 34 includes a dicing pattern 54, or two-dimensional grid array, that may be marked or projected onto interconnect surface 34. Dicing pattern 54 provides a guide for dicing panel into a plurality of singularized, or individual, semiconductor devices 52. Dashed lines are provided in FIGS. 3 and 4 to represent the border between adjacent semiconductor devices 52 in panel 26 corresponding to the location of dicing pattern 54.

Panel 26 is depicted as being generally circular in shape. However, the present invention applies equally to various other sizes and shapes of panel 26, such as a square or rectangular shape. As illustrated, each of semiconductor devices 52 includes an individual one of semiconductor dies 36. However, the present invention applies equally to the packaging of multi-chip modules, each of which includes multiple semiconductor dies 36 that can perform various functions. In addition, panel 26 is represented as being fully populated with unsingularized, or unseparated, semiconductor devices 52. However, substrate 30 of panel 26 need not be fully populated with semiconductor dies 36 in the instance when, for example, panel 26 is being fabricated in a prototype environment.

Panel 26 may warp during encapsulation and cure. As shown, panel 26 exhibits a warped or curved shape. Consequently, when panel 26 is mounted on support structure 28 with external surface 50 in contact with support structure 28 and surface 34 exposed, panel 26 cannot lie flat on support structure 28. Support structure 28 may be a conventional tape-less contact chuck, or vacuum chuck for high speed, automated handling equipment. Since panel 26 cannot lie flat on support structure 28, any processing of panel 26 taking place while panel 26 is mounted on support structure 28 may be unsuccessful because reliable vacuum cannot be achieved between support structure 28 and external surface 50 of panel 26. Thus, panel 26 cannot be adequately held by support structure 28 for solder deposition during screen printing, during dicing operations, and so forth. Execution of subsequent operations of semiconductor device fabrication process 20 reduces the warpage of panel 26 prior to further processing of panel 26.

With reference back to FIG. 1, following encapsulation task 24, process control continues with a task 56. At task 56, panel 26 (FIG. 2) is mounted to a support structure with an adhesive material in accordance with an embodiment of the invention. Further details of task 56 are provided in connection with the following descriptions of FIGS. 5-8.

Figure 5:
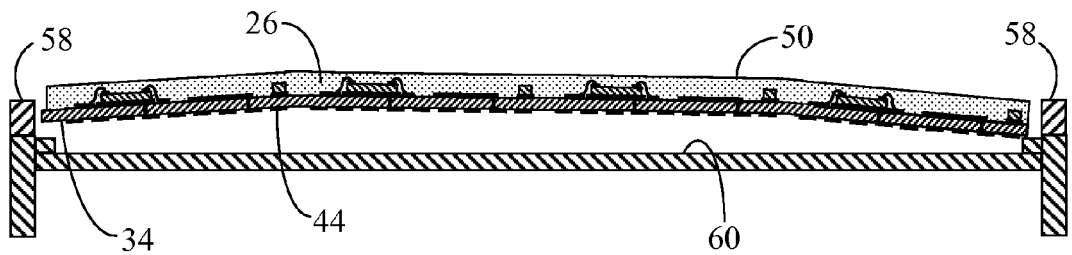
FIG. 5 shows a side view of the panel at an initial stage of processing to reduce the warpage in accordance with the semiconductor device fabrication process.

Referring to FIG. 5 in connection with task 56, FIG. 5 shows a side view of panel 26 at an initial stage of processing to reduce warpage of panel 26 in accordance with semiconductor device fabrication process 20. Panel 26 is mounted onto a film frame, also referred to as a tape frame 58, using a non-contact chuck 60. More particularly, outer edges of panel 26 are placed in abutment with non-contact chuck 60 with external surface 50 of panel 26 face up and interconnect surface 34 face down. In addition, interconnect surface 34 is suspended a distance above non-contact chuck 60 so that external contacts 44 are not damaged.

Figure 6:
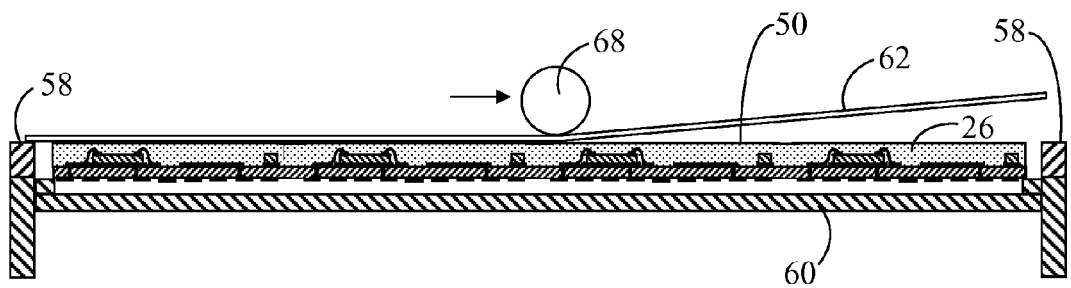
FIG. 6 shows a side view of the panel from FIG. 5 further along in processing.

FIG. 6 shows a side view of panel 26 from FIG. 5 further along in processing. As shown in FIG. 6, an adhesive material 62 is applied to external surface 50 to secure panel 26 to tape frame 58. In an embodiment, adhesive material 62 may be a roll of dicing tape that is applied to external surface 50 via a roller mechanism 64 that applies the appropriate pressure. Adhesive material 62 may be an ultraviolet (UV) tape commonly utilized to secure wafers or panels during dicing while allowing for easy removal following UV exposure.

Figure 7:
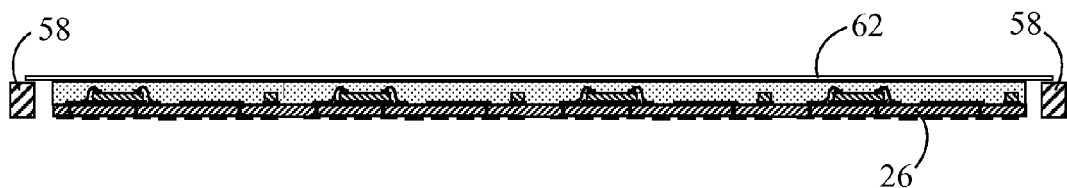
FIG. 7 shows a side view of the panel from FIG. 6 further along in processing.

FIG. 7 shows a side view of panel 26 from FIG. 6 further along in processing. More particularly, panel 26 is now removed from non-contact chuck 60 (FIG. 6) but remains attached to, i.e., adhered to, tape frame 58 via adhesive material 62.

Figure 8:
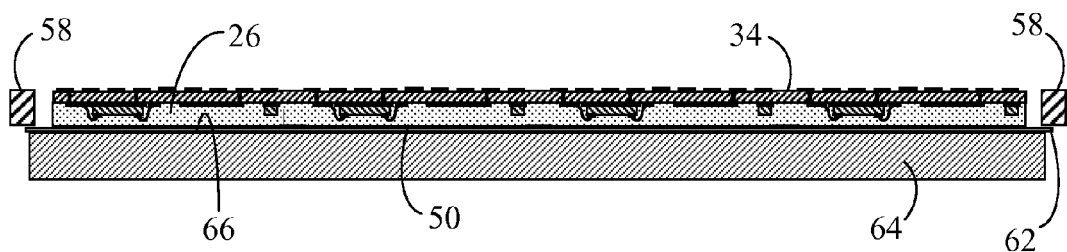
FIG. 8 shows a side view of the panel from FIG. 7 further along in processing.

FIG. 8 shows a side view of panel 26 from FIG. 7 further along in processing. Panel 26 is attached to a support structure 64 with interconnect surface 34 of panel 26 exposed and external surface 50 in contact with support structure 64. Thus, in this embodiment, support structure 64 may be considered a first support structure. It should be recalled that adhesive material 62 is applied to external surface 50 of panel 26. In an embodiment, support structure 64 is a porous vacuum chuck. Adhesive material 62 may be a single-sided tape that is used to "pull" panel 26 flat against support structure 64 thus permitting the warped panel 26 to be attached by vacuum to support structure 64 for subsequent operations. Accordingly, adhesive material 62 enables external surface 50 of panel 26 to be at least temporarily mounted flush with a contact surface 66 of support structure 64.

Referring back to FIG. 1, semiconductor device fabrication process 20 continues with a task 70 following mounting task 56. At task 70, a series of grooves is formed in interconnect surface 34. Further details of task 70 are provided in connection with the following description of FIG. 9.

Figure 9:
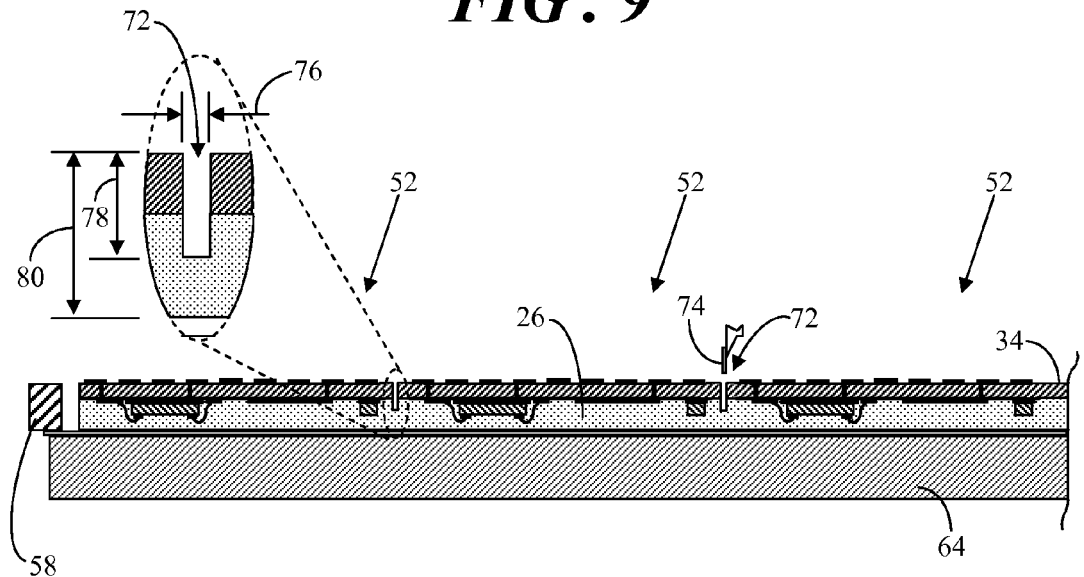
FIG. 9 shows a side view of the panel from FIG. 8 further along in processing.

FIG. 9 shows a side view of panel 26 from FIG. 8 further along in processing. More particularly, a series of grooves 72 are formed through interconnect surface 34 of panel 26. Grooves 72 function to alleviate stress in panel 26 and cause panel 26 to become pliable, so that the warping of panel 26 is substantially diminished. Panel 26 is shown as being slightly enlarged in the following FIGS. 9-14 relative to previous figures in order to better visualize grooves 72 and additional features of the methodology. In addition, FIG. 9 includes a magnified view of a portion of panel 26 in order to more clearly describe various dimensions of grooves 72.

Grooves 72 may be formed using a narrow dicing blade 74 of a standard dicing saw to yield a narrow groove width 76 for each of grooves 72. In other embodiments, grooves 72 may be formed by utilizing an etching technique. In accordance with embodiments of the invention, grooves 72 are formed coincident with dicing pattern 54 (FIG. 2) on interconnect surface 34 of panel 26. Accordingly, grooves 72 are arranged in both dimensions of the two-dimensional grid array of dicing pattern 54. In addition, groove width 76 is desirably narrower than a dice width subsequently made by a dicing tool to singularize semiconductor devices 52 of panel 26, as will be discussed in greater detail below.

Grooves 72 extend partially through panel 26 so that panel 26 remains intact, but is thinner at each of the locations of grooves 72. In a preferred embodiment, each of grooves 72 has a groove depth 78 that is no greater than approximately seventy percent of a thickness 80 of panel 26 and no less than twenty-five percent of thickness 80 of panel 26. This range for groove depth 74 enables stress relief in panel 26 and a reduction of the warpage of panel 26 without making panel 26 too fragile in the regions of grooves 72.

Referring back FIG. 1, following the formation of grooves 72 (FIG. 9) at task 70, fabrication process 20 continues with a task 82. At task 82, panel 26 is removed from support structure 64 (FIG. 8). Further details of task 82 are provided in connection with the following description of FIG. 10.

Figure 10:
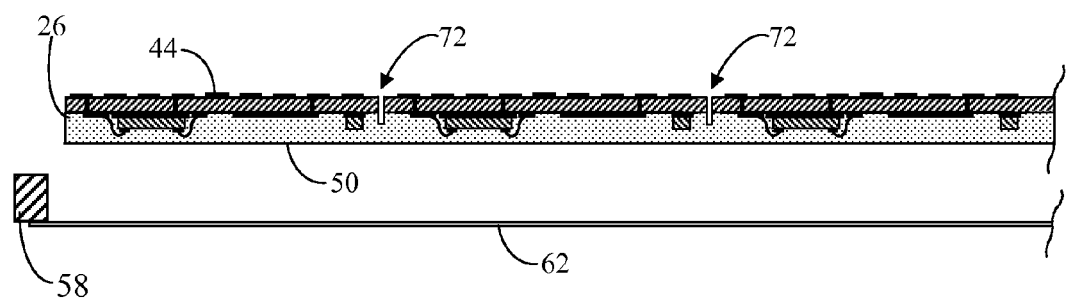
FIG. 10 shows a side view of the panel from FIG. 9 further along in processing.

FIG. 10 shows a side view of panel 26 from FIG. 9 further along in processing. As shown in FIG. 10, panel 26 has been removed from support structure 64 and tape frame 58. In addition, adhesive material 62 is removed from external surface 50 of panel 26. By way of example, when adhesive material 62 is UV dicing tape, panel 26 is exposed to UV so that panel 26 can be readily removed from attachment with adhesive material 62 and, consequently, with tape frame 58.

Referring back to FIG. 1, following the removal of panel 26 from support structure 26 (FIG. 8) at task 82, process control continues with a task 84. At task 84, panel 26 with significantly reduced warpage due to the judicious formation of grooves 72 (FIG. 9) in interconnect surface 34, is mounted to a tape-less support structure, such as a vacuum or electrostatic chuck.

Next, a task 86 is performed. At task 86, solder paste is applied to external contacts 44 of interconnect surface 34 of panel 26. Further details of tasks 84 and 86 are provided in connection with the following descriptions of FIGS. 11 and 12.

Figure 11:
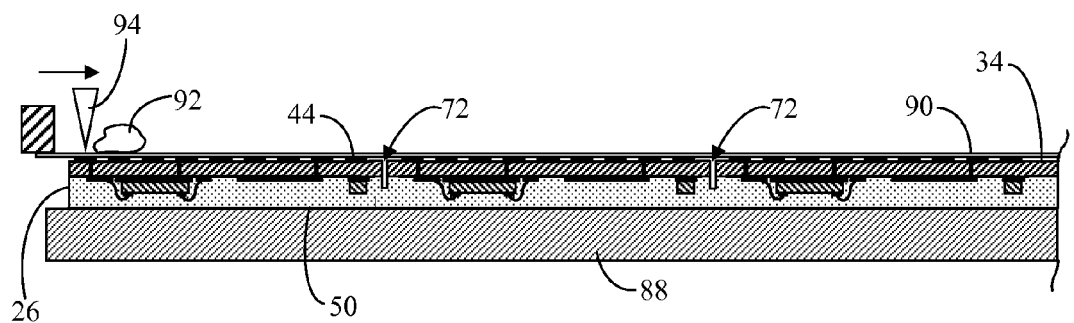
FIG. 11 shows a side view of the panel from FIG. 10 further along in processing.

FIG. 11 shows a side view of panel 26 from FIG. 10 further along in processing. Since the warpage of panel 26 has been alleviated by the formation of grooves 72, panel 26 can be mounted on a conventional support structure, such as a vacuum chuck 88 for a screen printer, and can be reliably held by vacuum chuck 88. Thus, in this embodiment, vacuum chuck 88 may be considered another support structure. Panel 26 is mounted with external surface 50 in contact with vacuum chuck 88 and with interconnect surface 34 exposed. In accordance with task 86 (FIG. 1), a stencil 90 is placed over interconnect surface 34. Stencil 90 contains apertures that align with external contacts 44 across interconnect surface 34. Solder is transferred through stencil 90 to interconnect surface 34 by pushing a bead of solder paste 92 across stencil 90 with a squeegee blade 94 or using other available and upcoming extrusion technologies.

Figure 12:
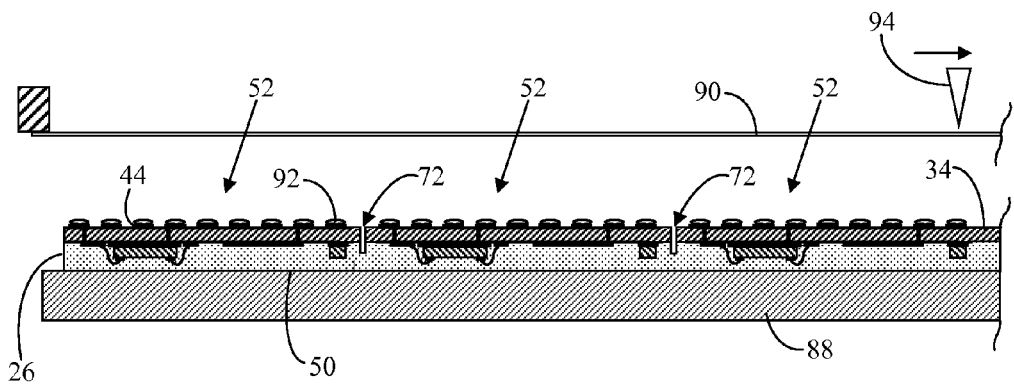
FIG. 12 shows a side view of the panel from FIG. 11 further along in processing.

FIG. 12 shows a side view of panel 26 from FIG. 11 further along in processing. As shown, stencil 90 is removed from contact with interconnect surface 44 following application of solder paste 92, in the form of solder bumps, onto external contacts 44.

Referring back to FIG. 1, following application of solder paste 92 onto external contacts 44 at task 86, process control proceeds to a task 96. At task 96, panel 26 is diced from interconnect surface 44 to singularize semiconductor devices 52. Further details of task 96 are provided in connection with the following descriptions of FIGS. 13-15. Other processing tasks performed prior to, during, or following dicing task 96 may entail integrated testing, marking, and so forth known to those skilled in the art and are not described herein for brevity. Following task 96 and any remaining processing tasks, semiconductor device fabrication process 20 ends.

Figure 13:
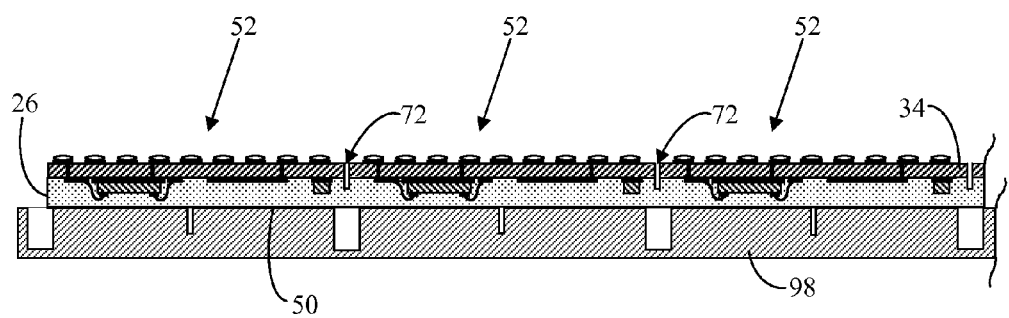
FIG. 13 shows a side view of the panel from FIG. 12 further along in processing.

FIG. 13 shows a side view of panel 26 from FIG. 12 further along in processing. As illustrated in FIG. 13, following stencil printing and solder reflow, panel 26 is mounted for dicing. Since warpage of panel 26 was previously alleviated and it is pliable, panel 26 can now be mounted on a support structure, such as a tape-less contact chuck 98 of conventional sawing or dicing equipment to singularize semiconductor devices 52. Panel 26 is mounted with external surface 50 in contact with tape-less chuck 98, and with interconnect surface 34 exposed. Its reduced warpage enables good contact of external surface 50 to tape-less chuck 98 and reliable vacuum can be applied to hold panel 26 to tape-less chuck 98.

Figure 14:
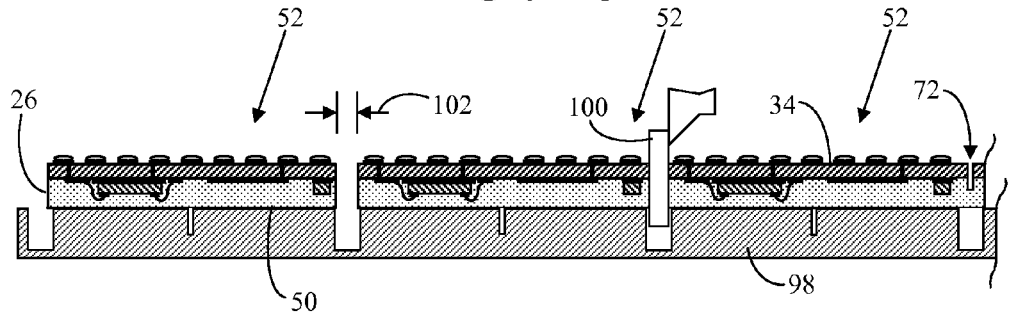
FIG. 14 shows a side view of the panel from FIG. 13 further along in processing.

FIG. 14 shows a side view of the panel from FIG. 13 further along in processing. In an embodiment, a through-cut blade 100 is utilized to dice through panel 26 from interconnect surface 34 in accordance with dicing pattern 54 (FIG. 2) and through the coincident grooves 72 to singularize, or separate, the multiple semiconductor devices 52 into individual semiconductor devices 52.

In an embodiment, blade 100 produces a dice width 102 through panel 26 that is greater than groove width 76 (FIG. 9) of each of grooves 72 (FIG. 9). More particularly, groove width 76 may be no greater than seventy percent of dice width 102. The greater dice width 102 relative to groove width 76 assures that no step or ledge is left on the edge of each semiconductor device 52 following dicing due to misalignment of grooves 52 during groove formation task 70 (FIG. 1). A step or ledge is undesirable for later processing and/or mounting tasks associated with semiconductor devices due to poor fit into sockets and other spaces.

Figure 15:
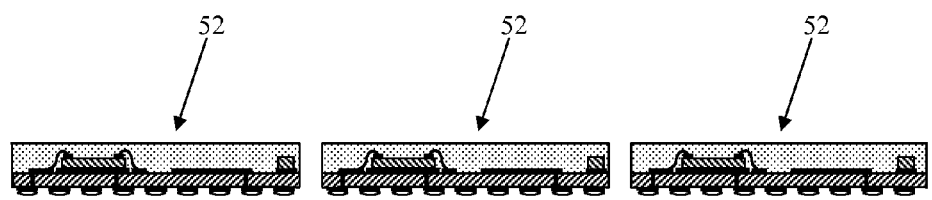
FIG. 15 shows a side view of semiconductor devices formed through the execution of the semiconductor device fabrication process of FIG. 1.

FIG. 15 shows a side view semiconductor devices 52 formed through the execution of the semiconductor device fabrication process 20 (FIG. 1). Following dicing, the individual semiconductor devices 52 may be removed from tape-less contact chuck 98 by pick and placement equipment for continued processing in accordance with design requirements.

Accordingly, semiconductor device fabrication process 20, including the formation of grooves 72 (FIG. 9) in interconnect surface 34 (FIG. 2) of panel 26, allows for reliable vacuum on tape-less support structures so as to enable consistent and time efficient solder printing and to enable singularizing (i.e., separating, dicing, or sawing) excessively warped large panel semiconductor device arrays on high speed fully automated handling equipment.

Semiconductor device fabrication process 20 is discussed in connection with forming grooves 72 to alleviate warpage of panel 26 prior to solder printing. In an alternative embodiment, a panel may have been previously solder printed or otherwise processed and is now ready to be diced. When such a panel is excessively warped, tasks 56, 70, 82, and 96 of FIG. 1 may be performed, with tasks 84 and 86 of FIG. 1 being bypassed. Tasks 56, 70, 82, and 96 can be performed to form grooves in the panel while the panel is mounted in a tape frame in order to alleviate panel warpage, followed by mounting the panel in a tape-less contact chuck of dicing equipment for semiconductor device singularization.

Figure 16:
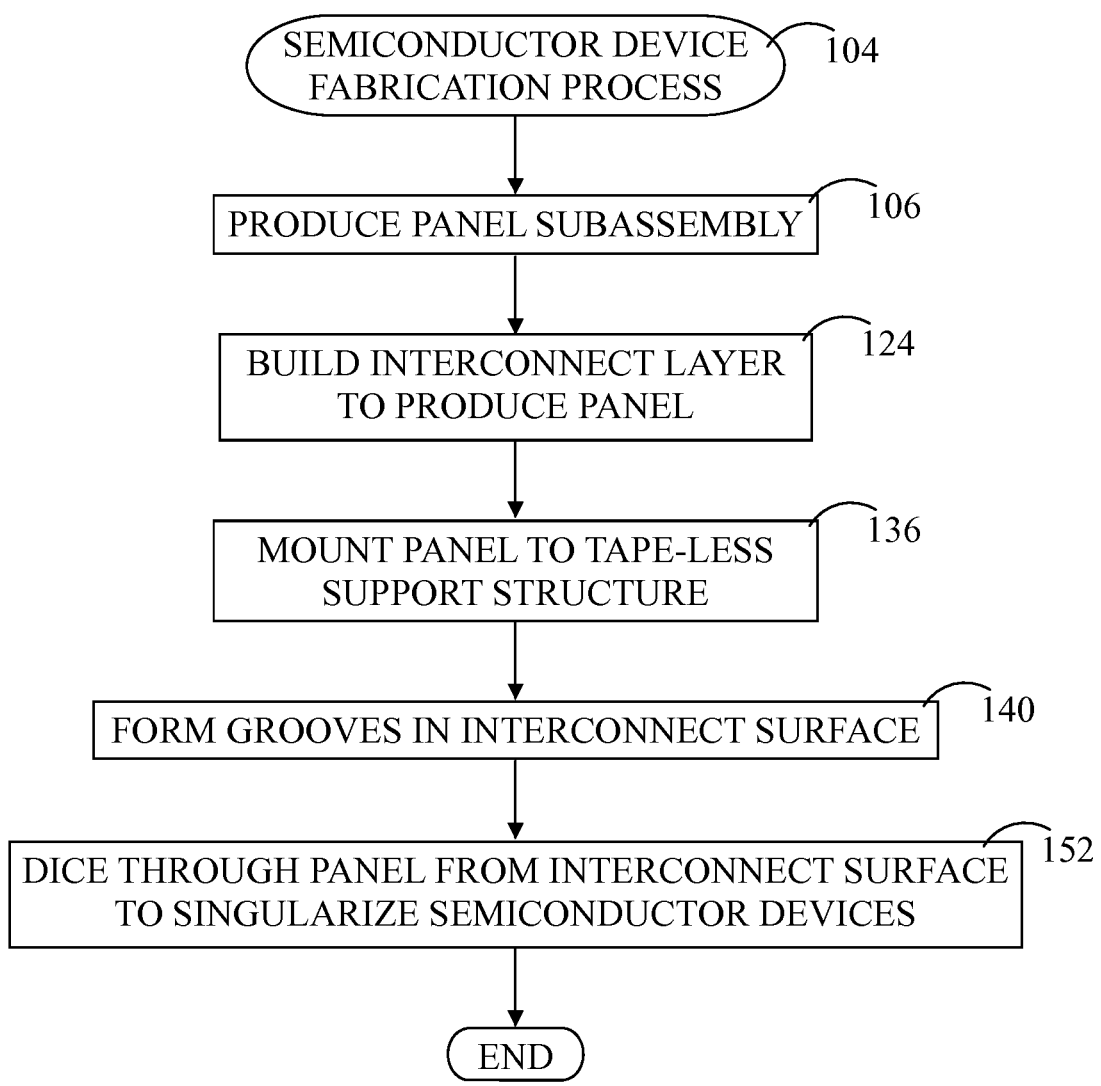
FIG. 16 shows a flowchart of a semiconductor device fabrication process in accordance with another embodiment of the invention.

FIG. 16 shows a flowchart of a semiconductor device fabrication process 104 in accordance with another embodiment of the invention. The operations that reduce panel warpage may also be implemented in connection with a chips-first packaging technique. A chips-first packaging technique is a technique in which semiconductor dies are mounted active side down to a releasable adhesive substrate and then encapsulated to form an extended surface around the die. The resulting panel array structure, also referred to as a panel, is released from the substrate and the interconnect circuitry is subsequently built on the active surfaces of the semiconductor dies and the extended surface in one or more interconnect layers. Encapsulation and build-up of the interconnect layers can cause packaging stress and severe warp of such panels, again resulting in an inability to attain a reliable vacuum using a conventional tape-less contact chuck.

Accordingly, semiconductor device fabrication process 104 begins with a task 106. At task 106, a panel subassembly is produced. Further details of task 106 are provided in connection with the following description of FIG. 17.

Figure 17:
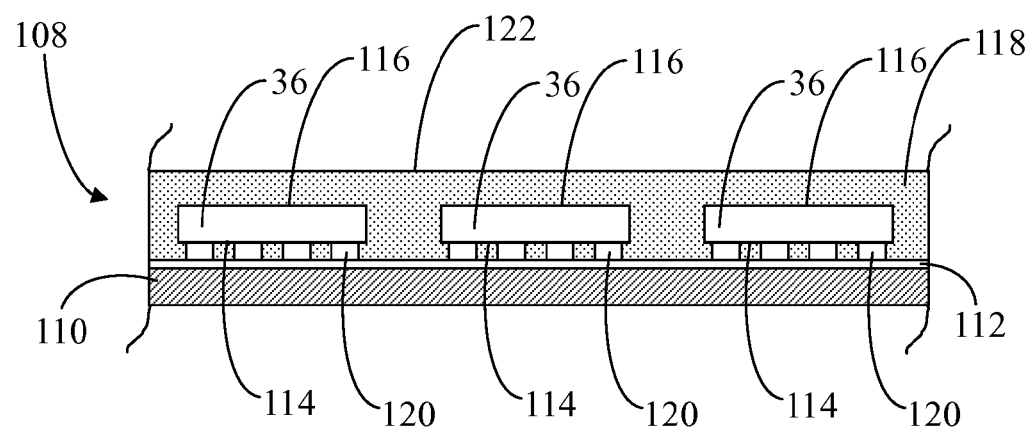
FIG. 17 shows a side view of a portion of a panel subassembly produced at an initial stage of processing in accordance with the semiconductor device fabrication process of FIG. 16.

FIG. 17 shows a side view of a portion of a panel subassembly 108 produced at an initial stage of processing in accordance with the semiconductor device fabrication process 104 of FIG. 16. Task 106 can entail attaching semiconductor dies 36 to a support substrate 110 via a release tape 112 with their active surfaces 114 face down on release tape 112 and their inactive surfaces 116 face up. An active surface of a semiconductor die refers to that side of the semiconductor die having device pads. In contrast, the inactive surface of a semiconductor die refers to that side of the semiconductor dies that does not have bond pads or external electrical contact sites.

An encapsulant layer 118 is then formed overlying inactive surfaces 116 of semiconductor dies 36 and their sides with a molding material to produce panel subassembly 108 of semiconductor dies 36. Since active surfaces 114 are affixed to release tape 112, the molding material is largely prevented from coating device pads 120 on active surfaces 114 of semiconductor dies 36. Encapsulant layer 118 has an outer encapsulant surface 122 that forms an external surface of panel subassembly 108. Accordingly, outer encapsulant surface 122 is referred to hereinafter as external surface 122.

Following encapsulation, other tasks may be performed such as curing the panel, backgrinding to the appropriate thickness, and so forth. Again, the term "producing" refers to fabricating all or a portion of panel subassembly 108 at the facility that is fabricating the semiconductor devices and/or acquiring panel subassembly 108 from a different manufacturing facility.

Referring back FIG. 16, following task 106 of semiconductor device fabrication process 104, process control continues with a task 124. At task 124, interconnect layers are built over panel subassembly 108 to produce a panel. Further details of task 124 are provided in connection with the following description of FIG. 18.

Figure 18:
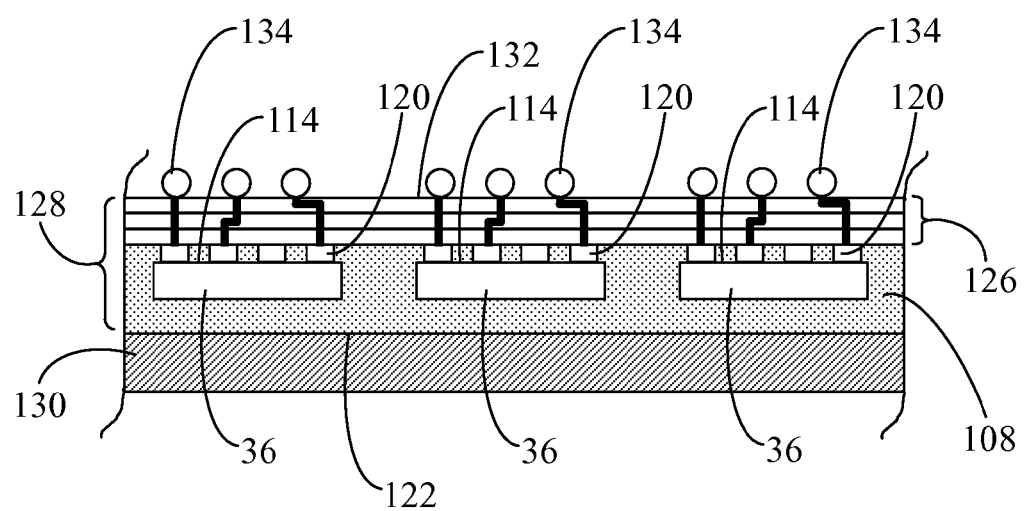
FIG. 18 shows a side view of the panel subassembly from FIG. 17 further along in processing.

FIG. 18 shows a side view of panel subassembly 108 from FIG. 17 further along in processing. Task 124 can entail build-up of one or more interconnect layers 126 above active surfaces 114 of semiconductor dies 36 to produce a panel 128. In particular, panel subassembly 108 is removed from support substrate 110 (FIG. 17) and any traces of release tape 112 (FIG. 17) are removed active surfaces 114 of semiconductor dies 36. Panel subassembly 108 is flipped and attached another support structure 130 with external surface 122 in contact with support structure 130 and active surfaces 114 faces up, or exposed.

Next, signal, power, and ground planar layers are built directly onto active surfaces 114 of semiconductor devices 36 to form one or more substantially planar (i.e., two dimensional) interconnect layers 126. Interconnect layers 126 have an outer interconnect surface 132 that forms an interconnect surface of panel 128 having external contacts 134 for electrical connection to external components (not shown). Accordingly, outer interconnect surface 132 is referred to hereinafter as interconnect surface 132. External contacts 134 on interconnect surface 132 are selectively interconnected with device pads 120 on active surfaces 114 of semiconductor dies 36 via interconnect layers 126. Interconnect layers 126 are formed to semiconductor dies 36 as an integral part of the processing, thus eliminating the need for wire bonds, tape-automated bonds (TABs), or solder bumps. Such a packaging technique can support high density interconnect routing capabilities between device pads 120 and external contacts 134, can minimize package area by reducing the distance between die contact and package ball grid array or pads, can improve power efficiency, and so forth.

Referring back to FIG. 16, following interconnect layer build-up task 124, semiconductor device fabrication process 104 continues with a task 136. At task 136, panel 128 is mounted to a tape-less support structure. Further details of task 136 are provided in connection with the following description of FIG. 19.

Figure 19:
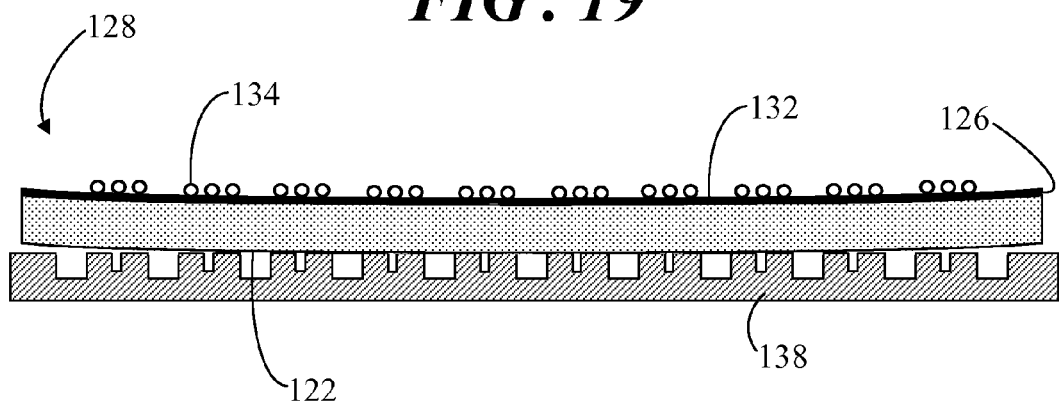
FIG. 19 shows a side view of the panel from FIG. 18 further along in processing.

FIG. 19 shows a side view of panel 128 from FIG. 18 further along in processing. At task 136, panel 128 is mounted on a support structure, in the form of a tape-less contact chuck 138. More particularly, interconnect surface 132 is exposed and external surface 122 of panel 128 is placed in contact with tape-less contact chuck 138. In this embodiment, panel 128 is excessively warped due to, for example, encapsulating, cure, and/or build-up of interconnect layers 126. Accordingly, panel 128 may not be reliably held by vacuum on contact chuck 138. Nevertheless, warpage in panel 128 may be alleviated prior to dicing on the same contact chuck 138, as discussed below, for improved processing efficiency and improved yield.

With reference back to FIG. 16, following task 136 process control continues with a task 140. At task 140, a series of grooves are formed in interconnect surface 132. Further details of task 140 are provided in connection with the following description of FIG. 20.

Figure 20:
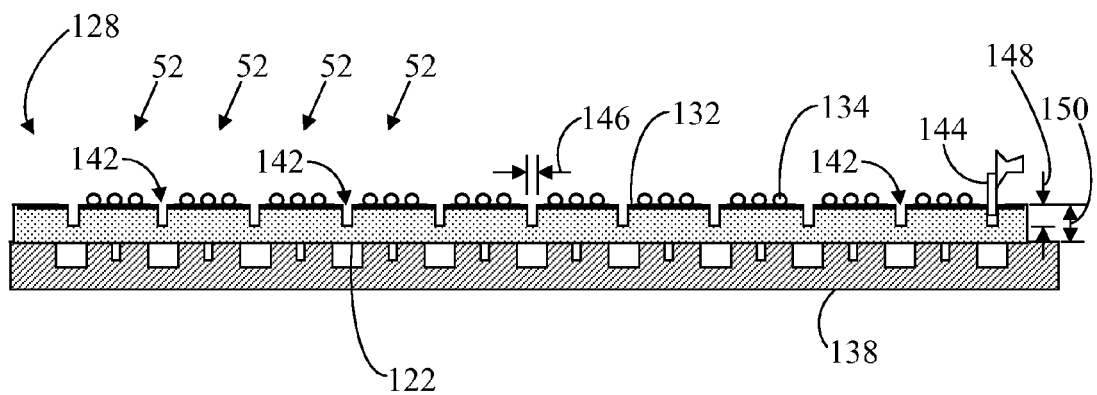
FIG. 20 shows a side view of the panel from FIG. 19 further along in processing.

FIG. 20 shows a side view of panel 128 from FIG. 19 further along in processing. More particularly, a series of grooves 142 are formed through interconnect surface 132 of panel 128 coincident with a dicing pattern, e.g., dicing pattern 54, on interconnect surface 132 of panel 128. Grooves 142 have many of the same features previously described in connection with grooves 72 (FIG. 9). For example, grooves 142 may be formed using a narrow dicing blade 144 to yield a narrow groove width 146 for each of grooves 142 that is desirably narrower than a dice width subsequently made by a dicing blade to singularize semiconductor devices 52 of panel 128, as will be discussed in greater detail below. In addition, grooves 142 extend partially through panel 128 so that panel 128 remains intact. For example, each of grooves 142 has a groove depth 148 that is in a range of approximately twenty-five to seventy percent of a thickness 150 of panel 128.

As discussed above in connection with grooves 72, grooves 142 function to alleviate stress in panel 128 so that the warping of panel 26 is substantially diminished. Accordingly, grooves 142 may be arranged in both dimensions of the two-dimensional grid array of the dicing pattern, e.g., dicing pattern 54. Following the formation of grooves 142 in panel 128, panel 128 becomes more pliable so that warpage in panel 128 is reduced. Its reduced warpage enables good contact of external surface 122 to tape-less chuck 138 and reliable vacuum may now be applied to hold panel 128 to tape-less chuck 138.

Referring back to FIG. 16, following task 140, process control continues with a task 152. At task 152, panel 128 is diced from interconnect surface 132 to singularize semiconductor devices 52. Further details of task 152 are provided in connection with the following description of FIG. 21. Other processing tasks performed prior to, during, or following dicing task 96 may entail integrated testing, marking, and so forth known to those skilled in the art and are not described herein for brevity. Following task 152 and any remaining processing tasks, semiconductor device fabrication process 104 ends.

Figure 21:
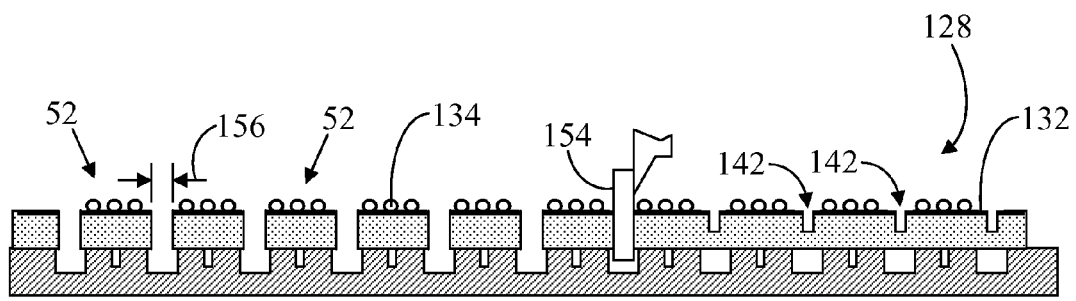
FIG. 21 shows a side view of the panel from FIG. 20 further along in processing.

FIG. 21 shows a side view of panel 128 from FIG. 20 further along in processing. As illustrated in FIG. 21, since warpage of panel 128 was previously alleviated, panel 128 can remain mounted on tape-less contact chuck 138 via vacuum attachment. A through-cut blade 154 is utilized to dice through panel 128 from interconnect surface 132 in accordance with its dicing pattern 54 (FIG. 2) and the coincident grooves 142 to singularize, or separate, the multiple semiconductor devices 52 into individual semiconductor devices 52.

In an embodiment, blade 154 produces a dice width 156 through panel 128 that is greater than groove width 146 (FIG. 20) for each of grooves 142. For example, groove width 146 may be no greater than seventy percent of dice width 156 to assure that no step or ledge is left on the edge of each semiconductor device 52 following dicing due to misalignment of grooves 142 during groove formation task 140 (FIG. 16).

Accordingly, semiconductor device fabrication process 104, including the formation of grooves 142 in interconnect surface 132 of panel 128, allows for reliable vacuum on tape-less support structures so as to enable the singulation of excessively warped large panel semiconductor device arrays on high speed fully automated handling equipment. Furthermore, since groove formation and dicing are performed on the same tape-less contact chuck, significant savings in process time and materials cost is achieved while concurrently increasing the yield of semiconductor devices 52 formed utilizing a chips-first technique.

Embodiments described herein comprise methodology for processing a panel during the formation of semiconductor devices. In particular, methodology entails forming grooves in an interconnect surface of the panel and extending partially through the panel and coincident with a dicing pattern for the panel. The grooves alleviate stress in the panel so that the panel becomes more pliable and less warped. Following groove formation and a reduction in warpage, the panel can undergo further processing, such as solder printing on the interconnect surface and/or subsequent through-cut dicing from the interconnect surface to singularize the plurality of semiconductor devices into individual semiconductor devices. Such methodology can achieve significant manufacturing savings while concurrently producing an increased yield in components.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method for processing a panel during the formation of semiconductor devices, said panel including a plurality of semiconductor dies interposed between first and second opposing external surfaces, wherein said first external surface is an interconnect surface, each of said plurality of semiconductor dies is in electrical communication with said interconnect surface, and said method comprises:

forming a series of grooves in said interconnect surface, said grooves extending partially through said panel so that said panel remains intact, said grooves being coincident with a dicing pattern for said panel, and said grooves having a groove width; and following said forming operation, dicing through said panel from said interconnect surface utilizing a dice tool in accordance with said dicing pattern to singularize said plurality of semiconductor devices, said dice tool producing a dice width through said panel that is greater than said groove width, and each of said semiconductor devices including at least one of said semiconductor dies.

2. A method as claimed in claim 1 wherein said panel exhibits a thickness and said forming operation forms said grooves having a depth no greater than seventy percent of said thickness.

3. A method as claimed in claim 1 wherein said panel exhibits a thickness and said forming operation forms said grooves having a depth no less than twenty-five percent of said thickness.

4. A method as claimed in claim 1 wherein said groove width is no greater than seventy percent of said dice width.

5. A method as claimed in claim 1 wherein said dicing pattern is a two-dimensional grid array over said interconnect surface, and said forming operation forms said series of grooves in both dimensions of said two-dimensional grid array.

6. A method as claimed in claim 1 further comprising:
   prior to said forming operation, mounting said panel on a support structure with said interconnect surface exposed and said second external surface in contact with said support structure; and
   performing said forming and dicing operations while said panel is mounted on said support structure.

7. A method as claimed in claim 6 wherein said support structure is a tape-less support structure.

8. A method as claimed in claim 1 further comprising:
   adhering said second surface of said panel to a first support structure using an adhesive material;
   performing said forming operation while said panel is adhered to said first support structure;
   following said forming operation, removing said panel from said first support structure;
   mounting said panel on a tape-less support structure with said interconnect surface exposed and said second external surface in contact with said tape-less support structure; and
   performing said dicing operation while said panel is mounted on said tape-less support structure.

9. A method as claimed in claim 1 wherein following said forming operation and prior to said dicing operation, said method further comprises:
   mounting said panel on a support structure with said interconnect surface exposed and said second external surface in contact with said support structure; and
   applying solder paste to said interconnect surface in accordance with a solder print pattern.

10. A method as claimed in claim 9 further comprising:
    following said mounting operation, placing a stencil over said interconnect surface; and
    said applying operation comprises transferring said solder paste through said stencil to said interconnect surface.

11. A method as claimed in claim 1 wherein prior to said forming operation said method further comprises:
    concurrently forming an encapsulant layer overlying an inactive surface of each of said plurality of semiconductor dies to produce a panel subassembly, said encapsulant layer having an outer encapsulant surface, said outer encapsulant surface being said second external surface of said panel; and
    building a substantially planar interconnect layer over an active surface of said each of said plurality of semiconductor dies to produce said panel, said active surface including device pads, said interconnect layer having an outer interconnect surface, said outer interconnect surface being said interconnect surface of said panel, said interconnect surface including external contacts interconnected with said device pads of said semiconductor dies.

12. A method for processing a panel during the formation of semiconductor devices, said panel including a plurality of semiconductor dies interposed between first and second opposing external surfaces, wherein said first external surface is an interconnect surface, each of said plurality of semiconductor dies is in electrical communication with said interconnect surface, and said method comprises:
    adhering said second external surface of said panel to a first support structure using an adhesive material;
    while said panel is adhered to said first support structure, forming a series of grooves in said interconnect surface, said grooves extending partially through said panel so that said panel remains intact, said grooves being coincident with a dicing pattern for said panel, and said grooves having a groove width;
    following said forming operation, removing said panel from said first support structure;
    mounting said panel on a second support structure with said interconnect surface exposed and said second external surface in contact with said second support structure;
    applying solder paste to said interconnect surface in accordance with a solder print pattern;
    following said applying operation, removing said panel from said second support structure;
    mounting said panel on a tape-less support structure with said interconnect surface exposed and said second external surface in contact with said tape-less support structure; and
    while said panel is mounted on said tape-less support structure, dicing through said panel from said interconnect surface utilizing a dice tool in accordance with said dicing pattern to singularize said plurality of semiconductor devices, said dice tool producing a dice width through said panel that is greater than said groove width, and each of said semiconductor devices including at least one of said semiconductor dies.

13. A method as claimed in claim 12 wherein said panel exhibits a thickness and said forming operation forms said grooves having a depth no less than twenty-five percent of said thickness.

14. A method as claimed in claim 12 wherein said dicing pattern is a two-dimensional grid array over said interconnect surface, and said forming operation forms said series of grooves in both dimensions of said two-dimensional grid array.

15. A method for processing a panel during the formation of semiconductor devices, said method comprising:
    concurrently forming an encapsulant layer overlying an inactive surface of each of a plurality of semiconductor dies to produce a panel subassembly, said encapsulant layer including an outer encapsulant surface;
    building a substantially planar interconnect layer over an active surface of said each of said plurality of semiconductor dies to produce said panel, said active surface including device pads, said interconnect layer including an outer interconnect surface having external contacts, said panel including said plurality of semiconductor dies interposed between said outer encapsulant surface and said outer interconnect surface, and said device pads are interconnected with said external contacts;
    forming a series of grooves in said outer interconnect surface, said grooves extending partially through said panel so that said panel remains intact, said grooves being coincident with a dicing pattern for said panel, said dicing pattern being a two-dimensional grid array over said outer interconnect surface, said forming operation forms said series of grooves in both dimensions of said two-dimensional grid array; and following said forming operation, dicing through said panel from said outer interconnect surface in accordance with said dicing pattern to singularize said semiconductor devices, each of said semiconductor devices including at least one of said semiconductor dies.

16. A method as claimed in claim 15 further comprising:

prior to said forming operation, mounting said panel on a tape-less support structure with said outer interconnect surface exposed and said outer encapsulant surface in contact with said tape-less support structure; and performing said forming and dicing operations while said panel is mounted on said tape-less support structure.

17. A method as claimed in claim 15 further comprising:

attaching said outer encapsulant surface of said panel to a first support structure using an adhesive material;

performing said forming operation while said panel is attached to said first support structure;

following said forming operation, removing said panel from said first support structure;

mounting said panel on a tape-less support structure with said outer interconnect surface exposed and said outer encapsulant surface in contact with said tape-less support structure; and performing said dicing operation while said panel is mounted in said tape-less support structure.

18. A method as claimed in claim 15 wherein following said forming operation and prior to said dicing operation, said method further comprises:

mounting said panel on a support structure with said outer interconnect surface exposed and said outer encapsulant surface in contact with said support structure; and applying solder paste to said outer interconnect surface in accordance with a solder print pattern.

19. A method as claimed in claim 18 wherein said support structure is a tape-less support structure, and said method further comprises:

prior to said mounting operation, attaching said outer encapsulant surface of said panel to a second support structure using an adhesive material;

performing said forming operation while said panel is attached to said second support structure;

following said forming operation, removing said panel from said second support structure;

performing said mounting said panel on said tape-less support structure subsequent to said removing operation and prior to said applying operation; and performing said dicing operation while said panel is mounted in said tape-less support structure subsequent to said applying operation.

* * * * *